US012777747B2

(12) United States Patent
Yoo et al.

(10) Patent No.: US 12,777,747 B2
(45) Date of Patent: Oct. 27, 2026

(54) MANUFACTURING APPARATUS AND MANUFACTURING METHOD FOR LIGHT-EMITTING DEVICE

(71) Applicant: SAMSUNG DISPLAY CO., LTD., Yongin-si (KR)

(72) Inventors: Je Won Yoo, Yongin-si (KR); Dong Gyun Kim, Yongin-si (KR); Hyun Min Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 663 days.

(21) Appl. No.: 17/926,031

(22) PCT Filed: Sep. 15, 2020

(86) PCT No.: PCT/KR2020/012447

§ 371 (c)(1),
(2) Date: Nov. 17, 2022

(87) PCT Pub. No.: WO2021/246578

PCT Pub. Date: Dec. 9, 2021

(65) Prior Publication Data

US 2023/0187578 A1 Jun. 15, 2023

(30) Foreign Application Priority Data

Jun. 2, 2020 (KR) ........................ 10-2020-0066647

(51) Int. Cl.
*H10H 20/821* (2025.01)
*H10H 20/01* (2025.01)
*H10W 90/00* (2026.01)

(52) U.S. Cl.
CPC .......... *H10H 20/821* (2025.01); *H10H 20/01* (2025.01); *H10W 90/00* (2026.01)

(58) Field of Classification Search
CPC .................................................... H10H 20/821
See application file for complete search history.

(56) References Cited

U.S. PATENT DOCUMENTS 8,530,357 B2 9/2013 Iwao
8,872,214 B2 10/2014 Negishi et al.
(Continued)

FOREIGN PATENT DOCUMENTS

CN 102630335 8/2012
CN 103608937 2/2014
(Continued)

OTHER PUBLICATIONS

Aslan Miriyev et al., "Soft material for soft actuators", Nature Communications, Sep. 19, 2017, p. 1-8.
(Continued)

*Primary Examiner* — Leonard Chang
*Assistant Examiner* — Hajar Kolahdouzan
(74) *Attorney, Agent, or Firm* — Womble Bond Dickinson (US) LLP

(57) ABSTRACT

A method of manufacturing a light emitting element includes providing light emitting patterns on a substrate, providing a soft material layer between the light emitting patterns, deforming the soft material layer, and separating the light emitting patterns from the substrate.

20 Claims, 13 Drawing Sheets

(56) References Cited

U.S. PATENT DOCUMENTS

| | | | | |
|---|---|---|---|---|
| 9,112,112 | B2 | 8/2015 | Do et al. | |
| 9,329,433 | B2 | 5/2016 | Negishi et al. | |
| 10,862,000 | B2 | 12/2020 | Min et al. | |
| 11,037,914 | B2 | 6/2021 | Kim | |
| 11,531,265 | B2 | 12/2022 | Guo | |
| 2006/0042322 | A1* | 3/2006 | Mendoza | G02B 6/124 65/390 |
| 2012/0302066 | A1* | 11/2012 | Iwao | H01L 21/0337 118/58 |
| 2013/0027623 | A1* | 1/2013 | Negishi | F21K 9/00 438/30 |
| 2014/0145237 | A1* | 5/2014 | Do | H10H 20/813 438/34 |
| 2019/0367692 | A1* | 12/2019 | Zhou | B33Y 70/00 |
| 2020/0047475 | A1* | 2/2020 | Gao | B32B 17/06 |

FOREIGN PATENT DOCUMENTS

| | | |
|---|---|---|
| CN | 107564856 | 1/2018 |
| CN | 109240040 | 1/2019 |
| JP | 2013-4661 | 1/2013 |
| JP | 2014-75550 | 4/2014 |
| KR | 10-1178468 | 9/2012 |
| KR | 10-2012-0138805 | 12/2012 |
| KR | 10-1244926 | 3/2013 |
| KR | 10-2019-0140545 | 12/2019 |
| KR | 10-2020-0005692 | 1/2020 |

OTHER PUBLICATIONS

Junho Lee et al., "A light-driven supramolecular nanowire actuator", Nanoscale, Mar. 16, 2015, pp. 6457-6461, vol. 7, No. 15.

International Search Report, with English translation, corresponding to International Application No. PCT/KR2020/012447 dated Mar. 2, 2021.

Written Opinion, with English translation, corresponding to International Application No. PCT/KR2020/012447, dated Mar. 2, 2021.

Chinese Office Action for Chinese Patent Application or Patent No. 202080100615.5, dated Dec. 26, 2024.

* cited by examiner

MANUFACTURING APPARATUS AND MANUFACTURING METHOD FOR LIGHT-EMITTING DEVICE

CROSS REFERENCE TO RELATED APPLICATION(S)

This application is a national entry of International Application No. PCT/KR2020/012447, filed on Sep. 15, 2020, which claims under 35 U.S.C. §§ 119 (a) and 365(b) priority to and benefits of Korean Patent Application No. 10-2020-0066647, filed on Jun. 2, 2020, in the Korean Intellectual Property Office (KIPO), the entire contents of which are incorporated herein by reference.

BACKGROUND

1. Technical Field

The disclosure relates to apparatus and method for manufacturing a light emitting element.

2. Background Art

As interest in information display increases and a demand for using a portable information medium increases, a demand and commercialization for a display device is focused.

SUMMARY

An object to be solved by the disclosure is to provide method and apparatus for manufacturing a light emitting element capable of minimizing a separation surface defect and a smash defect of the light emitting element.

An object is not limited to the object described above, and other technical objects which are not described will be clearly understood by those skilled in the art from the following description.

According to an embodiment of the disclosure for solving the above-described object, a method of manufacturing a light emitting element includes providing light emitting patterns on a substrate, providing a soft material layer between the light emitting patterns, deforming the soft material layer, and separating the light emitting patterns from the substrate.

The soft material layer may be contracted or expanded by an external stimulus, and a volume of the soft material layer may be changed.

The deforming of the soft material layer may include irradiating light to the soft material layer.

The soft material layer may include a photoactive polymer material.

The photoactive polymer material may include a trans-cis photoisomer.

The deforming of the soft material layer may include heating the soft material layer.

The soft material layer may include an elastomer.

The method may further include forming an insulating layer on the light emitting patterns.

The soft material layer may be provided directly on the insulating layer.

The soft material layer may be provided by slit coating, spin coating, or inkjet printing.

The method may further include removing the soft material layer between the deforming of the soft material layer and the separating of the light emitting patterns.

The providing of the light emitting patterns may include providing a light emitting stack on the substrate, and etching the light emitting stack.

The light emitting stack may include a first semiconductor layer, a second semiconductor layer disposed on the first semiconductor layer, and an active layer disposed between the first semiconductor layer and the second semiconductor layer.

According to an embodiment of the disclosure for solving the above-described object, an apparatus for manufacturing a light emitting element may include a stage on which a target substrate including light emitting patterns is disposed, a coating device that provides a soft material layer on the light emitting patterns, and a light irradiation device or a temperature control device that deforms the soft material layer.

The light irradiation device may contract or expands the soft material layer by irradiating light to the soft material layer.

The temperature control device may heat or cool the soft material layer to contract or expand the soft material layer.

The temperature control device may include an electric field applying device.

The temperature control device may include a thermoelectric element.

The details of other embodiments are included in the detailed description and drawings.

According to an embodiment, since light emitting patterns may be readily separated from a substrate as a soft material layer formed between the light emitting patterns is contracted and/or expanded by an external stimulus, a separation surface defect and a smash defect of a light emitting element may be reduced or minimized.

An effect according to embodiments is not limited by the contents discussed above, and more various effects are included in the specification.

DETAILED DESCRIPTION OF THE EMBODIMENTS

Figure 1:
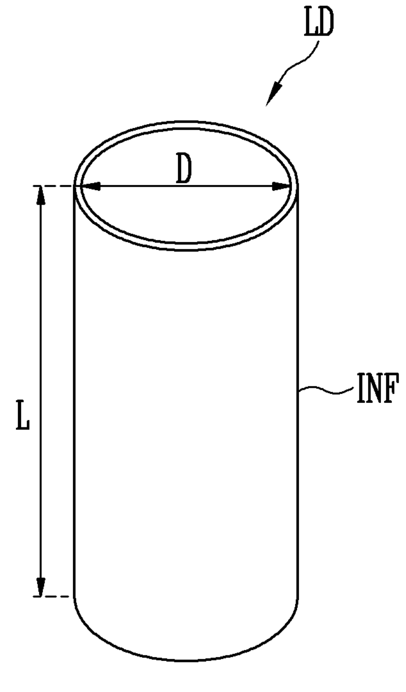
FIGS. 1 and 2 are schematic perspective and schematic cross-sectional views illustrating a light emitting element according to an embodiment.

The advantages and features and a method of achieving them will become apparent with reference to the embodiments described in detail below together with the accompanying drawings. However, the disclosure is not limited to the embodiments disclosed below, may be implemented in various different forms, and the disclosure is only defined by the scope of the claims.

A case in which an element or a layer is referred to as "on" another element or layer includes a case in which another layer or another element is disposed directly on the other element or between the other layers. The same reference numeral refers to the same reference component throughout the specification.

Although a first, a second, and the like are used to describe various components, these components are not limited by these terms. These terms are used only to distinguish one component from another component. Therefore, a first component described below may be a second component within the technical spirit. The singular expression includes a plural expression unless the context clearly dictates otherwise.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described in detail with reference to the accompanying drawings.

Figure 2:
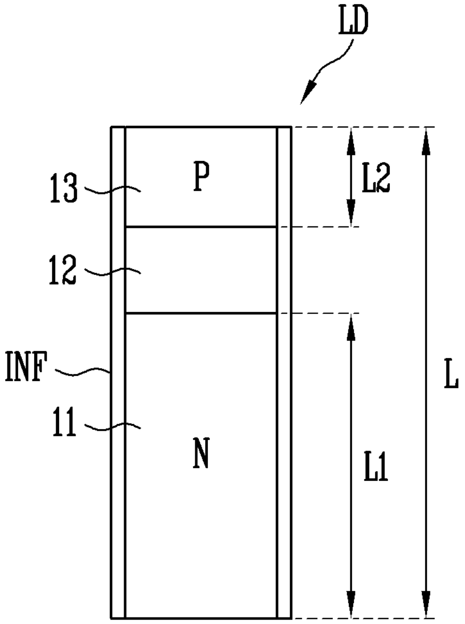

FIGS. 1 and 2 are schematic perspective and schematic cross-sectional views illustrating a light emitting element according to an embodiment. Although FIGS. 1 and 2 illustrate that a rod-shaped light emitting element LD of a cylindrical shape, a type and/or a shape of the light emitting element LD is not limited thereto.

Referring to FIGS. 1 and 2, the light emitting element LD may include a first semiconductor layer 11 and a second semiconductor layer 13, and an active layer 12 interposed between the first and second semiconductor layers 11 and 13. For example, the light emitting element LD may be configured as a stack in which the first semiconductor layer 11, the active layer 12, and the second semiconductor layer 13 are sequentially stacked each other in a direction.

According to an embodiment, the light emitting element LD may be provided in a rod shape extending in a direction. The light emitting element LD may have an end and another end in the direction.

According to an embodiment, one of the first and second semiconductor layers 11 and 13 may be disposed at the end of the light emitting element LD, and the other of the first and second semiconductor layers 11 and 13 may be disposed at the another end of the light emitting element LD.

According to an embodiment, the light emitting element LD may be a rod-shaped light emitting diode manufactured in a rod shape. Here, the rod shape encompasses a rod-like shape or a bar-like shape that is longer in a longitudinal direction than a width direction (e.g., having an aspect ratio greater than 1), such as a cylinder or polygonal column, and the shape of a cross-section thereof is not particularly limited. For example, a length L of the light emitting element LD may be greater than a diameter D (or a width of the cross-section) thereof.

According to an embodiment, the light emitting element LD may have a size as small as a nano scale to a micro scale (nanometer scale to micrometer scale), for example, the diameter D and/or the length L of a range of about 100 nm to about 10 μm. However, the size of the light emitting element LD is not limited thereto. For example, the size of the light emitting element LD may be variously changed according to a design condition of various devices using the light emitting element LD as a light source, for example, a display device or the like.

The first semiconductor layer 11 may include at least one n-type semiconductor material. For example, the first semiconductor layer 11 may include at least one semiconductor material among InAlGaN, GaN, AlGaN, InGaN, AlN, and InN, and may include an n-type semiconductor material doped with a first conductive dopant such as Si, Ge, or Sn, but is not limited thereto.

The active layer 12 may be disposed on the first semiconductor layer 11 and may be formed in a single or multiple quantum well structure. In an embodiment, a clad layer (not shown) doped with a conductive dopant may be formed on and/or under of the active layer 12. For example, the clad layer may be formed of an AlGaN or an InAlGaN. According to an embodiment, a material of AlGaN, InAlGaN, or the like may be used to form the active layer 12, and various materials other than the material described above may configure the active layer 12. The active layer 12 may be disposed between the first semiconductor layer 11 and the second semiconductor layer 13 which will be described below.

In case that a voltage greater than or equal to a threshold voltage is applied to ends of the light emitting element LD, the light emitting element LD may emit light while electron-hole pairs are combined in the active layer 12. By controlling light emission of the light emitting element LD using this principle, the light emitting element LD may be used as a light source of various light emitting elements including a pixel of a display device.

The second semiconductor layer 13 may be disposed on the active layer 12 and may include a semiconductor material of a type different from that of the first semiconductor layer 11. For example, the second semiconductor layer 13 may include at least one p-type semiconductor material. For example, the second semiconductor layer 13 may include at least one semiconductor material among InAlGaN, GaN, AlGaN, InGaN, AlN, and InN, and may include a p-type semiconductor material doped with a second conductive dopant such as Mg. However, the material configuring the second semiconductor layer 13 is not limited thereto, and various materials other than the material described above may configure the second semiconductor layer 13. According to an embodiment, a first length L1 of the first semiconductor layer 11 may be longer than a second length L2 of the second semiconductor layer 13.

As described above, when the semiconductor layers 11 and 13 and the active layer 12 of the light emitting element LD include nitrogen (N), the light emitting element LD may emit blue light of which a central wavelength band has a range of about 400 nm to about 500 nm or green light of which a central wavelength band has a range of about 500 nm to about 570 nm. However, it should be understood that the central wavelength band of the blue light and the green light is not limited to the above-described range, and includes all wavelength ranges that may be recognized as blue or green in the technical field.

According to an embodiment, the light emitting element LD may further include an insulating layer INF provided on a surface thereof. The insulating layer INF may be formed on the surface of the light emitting element LD to surround at least an outer circumferential surface of the active layer 12, and may further surround areas of the first and second semiconductor layers 11 and 13.

According to an embodiment, the insulating layer INF may expose the ends of the light emitting element LD having different polarities. For example, the insulating layer INF may not cover and may expose ends of each of the first and second semiconductor layers 11 and 13 positioned at the ends of the light emitting element LD in the longitudinal direction, for example, two planes (e.g., an upper surface and a lower surface) of a cylinder. In some other embodiments, the insulating layer INF may expose the ends of the light emitting element LD having different polarities and sides of the semiconductor layers 11 and 13 adjacent to the ends.

According to an embodiment, the insulating layer INF be configured as a single layer or multiple layers by including at least one insulating material among silicon dioxide ($SiO_2$), silicon nitride ($Si_3N_4$), aluminum oxide ($Al_2O_3$), and titanium dioxide ($TiO_2$) (for example, double layers configured of aluminum oxide ($Al_2O_3$) and silicon dioxide ($SiO_2$), but is not limited thereto.

In an embodiment, the light emitting element LD may further include an additional component in addition to the first semiconductor layer 11, the active layer 12, the second semiconductor layer 13, and/or the insulating layer INF. For example, the light emitting element LD may additionally include one or more phosphor layers, active layers, semiconductor materials and/or electrode layers disposed on an end of the first semiconductor layer 11, the active layer 12, and/or the second semiconductor layer 13.

Figure 3:
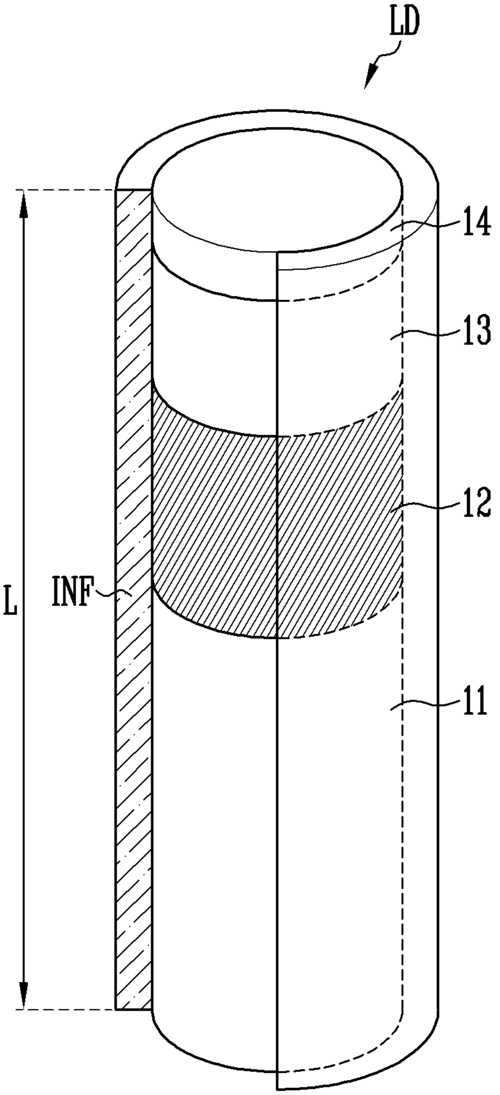
FIG. 3 is a schematic perspective view illustrating a light emitting element according to still another embodiment.

FIG. 3 is a schematic perspective view illustrating a light emitting element according to still another embodiment. FIG. 3 illustrates that a portion of the insulating layer INF is omitted for convenience of description.

Referring to FIG. 3, the light emitting element LD may further include an electrode layer 14 disposed on the second semiconductor layer 13. The electrode layer 14 may be an ohmic contact electrode electrically connected to the second semiconductor layer 13, but is not limited thereto. According to an embodiment, the electrode layer 14 may be a Schottky contact electrode. The electrode layer 14 may include a metal or a metal oxide, and for example, Cr, Ti, Al, Au, Ni, ITO, IZO, ITZO, and an oxide or an alloy thereof may be used alone or in combination. The electrode layer 14 may be substantially transparent or translucent. Therefore, light generated in the active layer 12 of the light emitting element LD may pass through the electrode layer 14 and may be emitted to the outside of the light emitting element LD. Although not shown separately, in another embodiment, the light emitting element LD may further include an electrode layer disposed on the first semiconductor layer 11.

Figure 4:
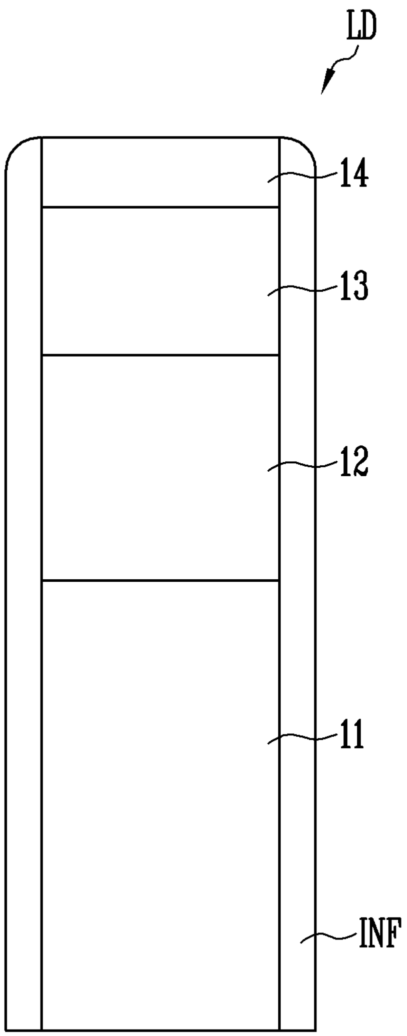
FIG. 4 is a schematic cross-sectional view illustrating a light emitting element according to still another embodiment.

FIG. 4 is a schematic cross-sectional view illustrating a light emitting element according to still another embodiment.

Referring to FIG. 4, an insulating layer INF may have a curved shape in a corner area adjacent to the electrode layer 14. According to an embodiment, the curved surface may be formed by etching in a manufacturing process of the light emitting element LD.

Although not shown separately, also in the light emitting element of another embodiment having a structure further including an electrode layer disposed on the above-described first semiconductor layer 11, the insulating layer INF may have a curved shape in an area thereof adjacent to the electrode layer.

Figure 5:
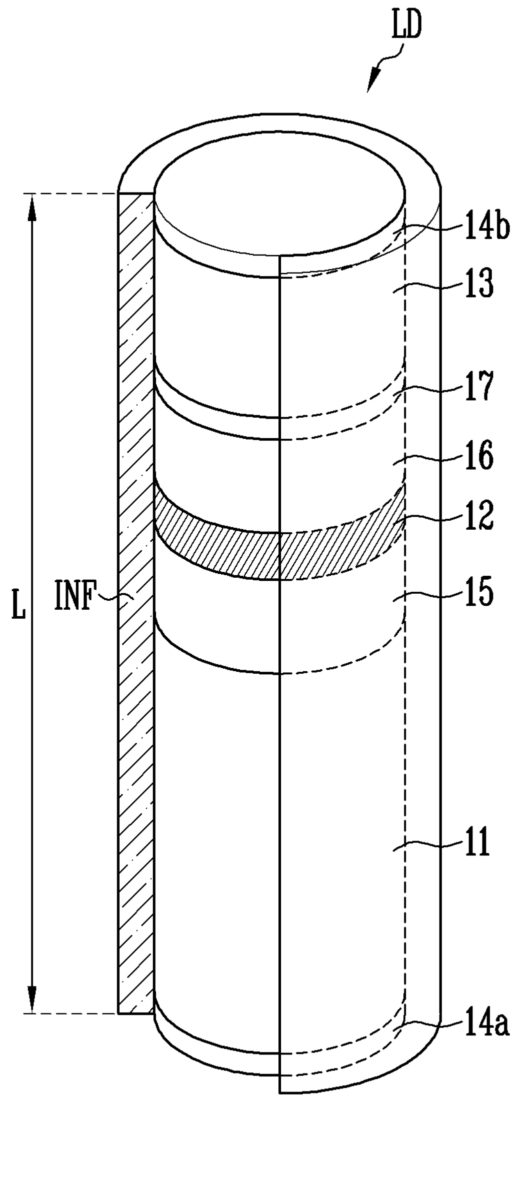
FIG. 5 is a schematic perspective view illustrating a light emitting element according to still another embodiment.

FIG. 5 is a schematic perspective view illustrating a light emitting element according to still another embodiment. FIG. 5 illustrates that a portion of the insulating layer INF is omitted for convenience of description.

Referring to FIG. 5, the light emitting element LD may further include a third semiconductor layer 15 disposed between the first semiconductor layer 11 and the active layer 12, and a fourth semiconductor layer 16 and a fifth semiconductor layer 17 disposed between the active layer 12 and the second semiconductor layers 13. The light emitting element LD of FIG. 5 is different from the embodiment of FIG. 1, in that the semiconductor layers 15, 16, and 17 and electrode layers 14*a* and 14*b* are further disposed, and the active layer 12 includes another element. Since a disposition and a structure of the insulating layer INF are substantially the same as those of FIG. 1, an overlapping content is omitted and a different point is described.

In the light emitting element LD of FIG. 5, each of the active layer 12 and the other semiconductor layers 11, 13, 15, 16 and 17 may be a semiconductor including at least phosphorus (P). For example, the light emitting element LD according to an embodiment may emit red light of which a center wavelength band has a range of about 620 nm to about 750 nm. However, it should be understood that the center wavelength band of the red light is not limited to the above-described range and includes all wavelength ranges that may be recognized as red in the technical field.

Specifically, the first semiconductor layer 11 may include at least one of InAlGaP, GaP, AlGaP, InGaP, AlP, and InP doped with an n-type dopant in case that the light emitting element LD emits red light. The first semiconductor layer 11 may be doped with an n-type dopant, and for example, the n-type dopant may be Si, Ge, Sn, or the like. In an embodiment, the first semiconductor layer 11 may be n-AlGaInP doped with n-type Si.

The second semiconductor layer 13 may be at least one of InAlGaP, GaP, AlGaNP, InGaP, AlP, and InP doped with a p-type dopant in case that the light emitting element LD emits red light. The second semiconductor layer 13 may be doped with a p-type dopant, and for example, the p-type dopant may be Mg, Zn, Ca, Se, Ba, or the like. In an embodiment, the second semiconductor layer 13 may be p-GaP doped with p-type Mg.

The active layer 12 may be disposed between the first semiconductor layer 11 and the second semiconductor layer 13. Similar to the active layer 12 of FIG. 1, the active layer 12 of FIG. 5 may also emit light of a specific wavelength band by including a single or multiple quantum well structure material. For example, in case that the active layer 12 emits light of a red wavelength band, the active layer 12 may include a material of AlGaP, AlInGaP, or the like. In particular, in case that the active layer 12 has a structure in which a quantum layer and a well layer are alternately stacked each other in a multiple quantum well structure, the quantum layer may include a material such as AlGaP or AlInGaP, and the well layer may include a material such as GaP or AlInP. In an embodiment, the active layer 12 may emit red light having a center wavelength band of about 620 nm to about 750 nm by including AlGaInP as the quantum layer and AlInP as the well layer.

The light emitting element LD of FIG. 5 may include a clad layer disposed adjacent to the active layer 12. As shown in the drawing, the third semiconductor layer 15 and the fourth semiconductor layer 16 disposed between the first semiconductor layer 11 and the second semiconductor layer 13 on and under the active layer 12 may be clad layers.

The third semiconductor layer 15 may be disposed between the first semiconductor layer 11 and the active layer 12. The third semiconductor layer 15 may be an n-type semiconductor substantially identical or similar to the first semiconductor layer 11, and for example, the first semiconductor layer 11 may be n-AlGaInP, and the third semiconductor layer 15 may be n-AlInP, but are not limited thereto.

The fourth semiconductor layer 16 may be disposed between the active layer 12 and the second semiconductor layer 13. The fourth semiconductor layer 16 may be an n-type semiconductor substantially identical or similar to the second semiconductor layer 13, and for example, the second semiconductor layer 13 may be p-GaP, and the fourth semiconductor layer 16 may be p-AlInP.

The fifth semiconductor layer 17 may be disposed between the fourth semiconductor layer 16 and the second semiconductor layer 13. The fifth semiconductor layer 17 may be a p-doped semiconductor substantially identical or similar to the second semiconductor layer 13 and the fourth semiconductor layer 16. In some embodiments, the fifth semiconductor layer 17 may perform a function of reducing a lattice constant difference between the fourth semiconductor layer 16 and the second semiconductor layer 13. For example, the fifth semiconductor layer 17 may be a tensile strain barrier reducing (TSBR) layer. For example, the fifth semiconductor layer 17 may include p-GaInP, p-AlInP, p-AlGaInP, and the like, but is not limited thereto.

The first electrode layer 14*a* and the second electrode layer 14*b* may be disposed on the first semiconductor layer 11 and the second semiconductor layer 13, respectively. The first electrode layer 14*a* may be disposed on a lower surface of the first semiconductor layer 11, and the second electrode layer 14*b* may be disposed on an upper surface of the second semiconductor layer 13. However, the disclosure is not limited thereto, at least one of the first electrode layer 14*a* and the second electrode layer 14*b* may be omitted. For example, in the light emitting element LD, the first electrode layer 14*a* may not be disposed on the lower surface of the first semiconductor layer 11, and only a second electrode layer 14*b* may be disposed on the upper surface of the second semiconductor layer 13. Each of the first electrode layer 14*a* and the second electrode layer 14*b* may include at least one of the materials that may be used to form the electrode layer 14 of FIG. 3, e.g., as discussed herein.

Subsequently, a method of manufacturing the light emitting element according to the above-described embodiment is described. In the following embodiment, an application of the light emitting element LD shown in FIG. 4 is described, but those skilled in the art may apply various shapes of light emitting elements including the light emitting element LD shown in FIGS. 1 to 5 and the like embodiments.

FIGS. 6 to 16 are schematic cross-sectional views of a method of manufacturing a light emitting element for each process step according to an embodiment. Hereinafter, components substantially identical to those of FIGS. 1 to 5 are denoted by the same reference numerals and detailed reference numerals are omitted.

Figure 6:
FIGS. 6 to 16 are schematic cross-sectional views of a method of manufacturing a light emitting element for each process step according to an embodiment.

Referring to FIG. 6, first, a substrate 1 configured to support the light emitting element LD is prepared. The substrate 1 may include a sapphire substrate and a transparent substrate such as glass. However, the disclosure is not limited thereto, and may be formed of a conductive substrate such as GaN, SiC, ZnO, Si, GaP, and GaAs. Hereinafter, a case where the substrate 1 is a sapphire substrate is described as an example. A thickness of the substrate 1 is not particularly limited, but as an example, the thickness of the substrate 1 may be about 400 um to about 1500 um.

Figure 7:
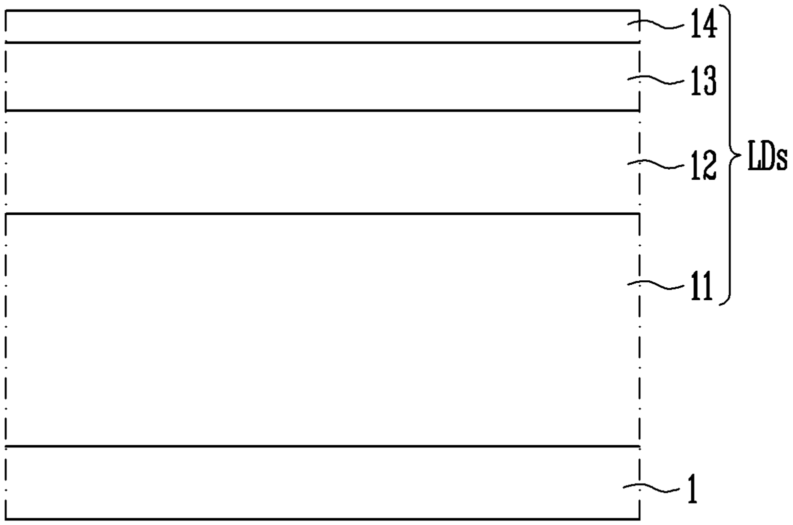

Referring to FIG. 7, subsequently, a light emitting stack LDs is formed on the substrate 1. The light emitting stack LDs may be formed by growing a seed crystal by an epitaxial method. According to an embodiment, the light emitting stack LDs may be formed by electron beam deposition, physical vapor deposition (PVD), chemical vapor deposition (CVD), plasma laser deposition (PLD), dual-type thermal evaporation, sputtering, or metal organic chemical vapor deposition (MOCVD), preferably, MOCVD, but is not limited thereto.

A precursor material for forming the light emitting stack LDs is not particularly limited within a range that may be generally selected for forming the target material. For example, the precursor material may be a metal precursor including an alkyl group such as a methyl group or an ethyl group. For example, the precursor material may be a compound such as trimethyl gallium ($Ga(CH_3)_3$), trimethyl aluminum ($Al(CH_3)_3$), or triethyl phosphate ($(C_2H_5)_3PO_4$), but is not limited thereto. The light emitting stack LDs may include the first semiconductor layer 11, the active layer 12, the second semiconductor layer 13, and the electrode layer 14 that are sequentially stacked each other. Since the first semiconductor layer 11, the active layer 12, the second semiconductor layer 13, and the electrode layer 14 are described with reference to FIGS. 1 to 5, an overlapping content is omitted.

Although not shown separately, a buffer layer and/or a sacrificial layer may be further disposed between the substrate 1 and the first semiconductor layer 11. The buffer layer may serve to reduce a lattice constant difference between the substrate 1 and the first semiconductor layer 11. For example, the buffer layer may include an undoped semiconductor, the buffer layer and the first semiconductor layer 11 may include substantially a same material, and the buffer layer may be a material that is not doped with n-type or p-type dopant. In an embodiment, the buffer layer may be at least one of undoped InAlGaN, GaN, AlGaN, InGaN, AlN, and InN, but is not limited thereto. The sacrificial layer may include a material capable of smoothly growing a crystal of the semiconductor layer in a subsequent process. The sacrificial layer may include at least one of an insulating material and a conductive material. For example, the sacrificial layer may include silicon oxide ($SiO_x$), silicon nitride ($SiN_x$), silicon oxynitride ($SiO_xN_y$), or the like as an insulating material, and may include ITO, IZO, IGO, ZnO, graphene, graphene oxide, or the like as a conductive material, but is not limited thereto.

Figure 8:
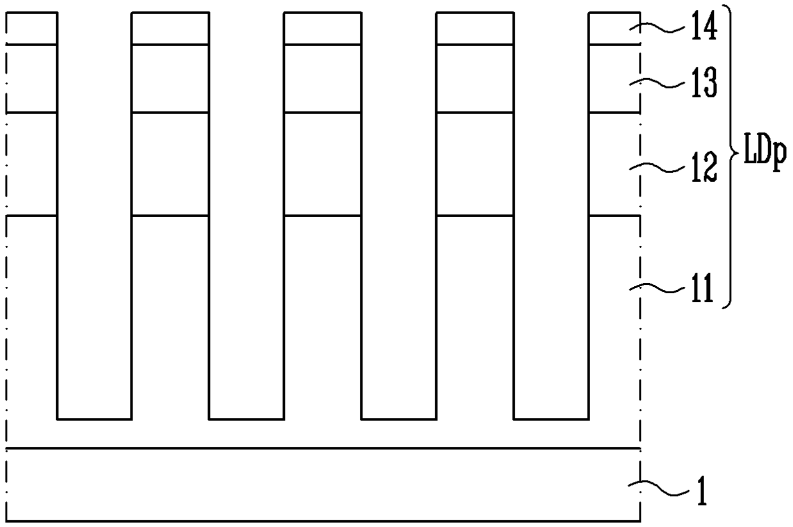

Referring to FIG. 8, subsequently, the light emitting stacks LDs are etched in a direction perpendicular to the substrate 1 to form light emitting patterns LDp. A process of etching the light emitting stack LDs may be performed by a general method. For example, an etching process may be a dry etching method, a wet etching method, reactive ion etching (RIE), inductively coupled plasma reactive ion etching (ICP-RIE), or the like. In a case of the dry etching method, anisotropic etching may be possible, and thus the dry etching method may be suitable for vertical etching. In case that the above-described etching method is used, an etching etchant may be $Cl_2$, $O_2$, or the like but is not limited thereto.

Figure 9:
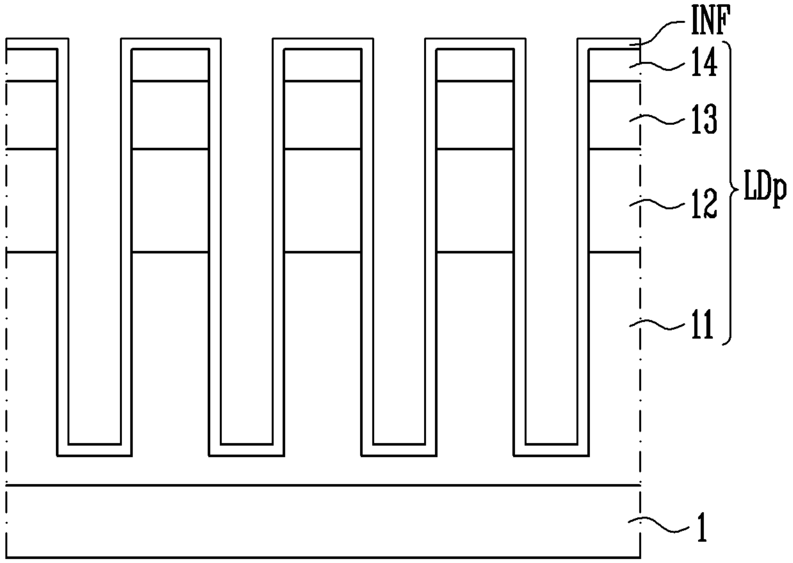
Figure 10:
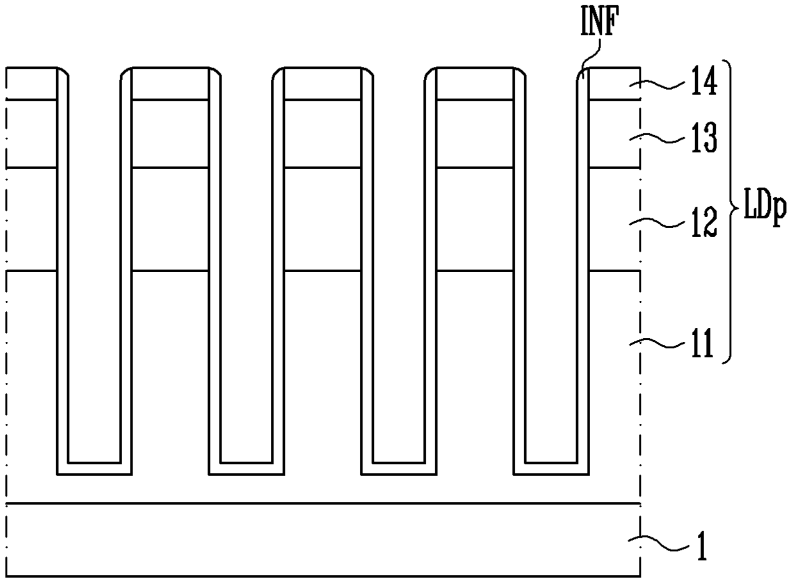

Referring to FIGS. 9 and 10, subsequently, the insulating layer INF surrounding an outer surface of the light emitting patterns LDp is formed. The insulating layer INF may be formed to surround an outer surface of each of the light emitting patterns LDp, and may be partially removed to expose an upper surface of the electrode layer 14. The insulating layer INF may be formed using a method of coating or immersing an insulating material on the outer surface of the light emitting pattern LDp, but the disclosure is not limited thereto. For example, the insulating layer INF may be formed by atomic layer deposition (ALD).

Figure 11:
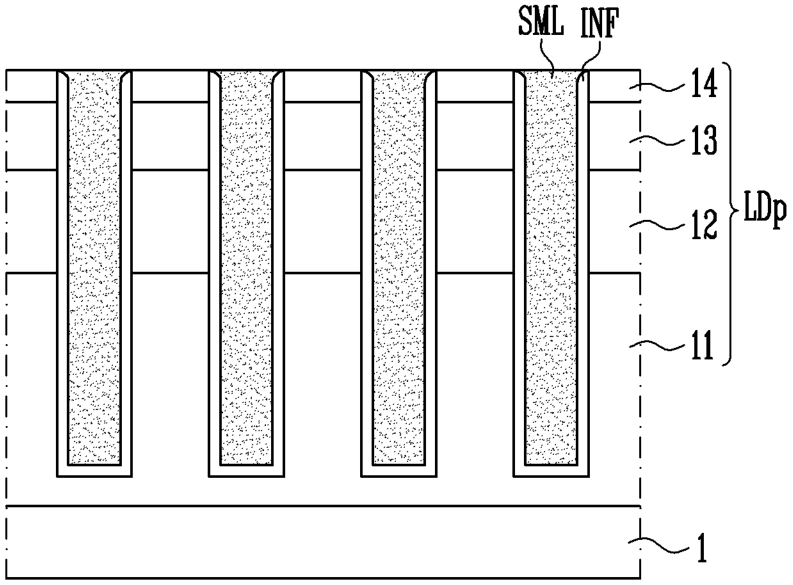

Referring to FIG. 11, subsequently, a soft material layer SML is formed in a space between the light emitting patterns LDp. The soft material layer SML may be formed directly on the above-described insulating layer INF.

The soft material layer SML may be formed by coating a soft material composition between the light emitting patterns LDp, and a method of coating the composition may be performed by slit coating, spin coating, or an inkjet printing method, but is not limited thereto.

The soft material layer SML may include a soft material that may be contracted or expanded by an external stimulus to change a volume thereof. In an embodiment, the soft material layer SML may include a photoactive polymer material. For example, the soft material layer SML may include a trans-cis photoisomer as the photoactive polymer material. For example, the soft material layer SML may include a diazo-based or triazo-based compound, but is not limited thereto. In case that the soft material layer SML includes the photoactive polymer material, a macroscopic volume change of the soft material layer SML may be caused by irradiating light of a wavelength that enables cis-trans isomerization of the photoactive polymer material to change a molecular structure through photoisomerization.

According to an embodiment, the soft material layer SML may include an elastomer. For example, the soft material layer SML may include styrene-based elastomers, olefin-based elastomers, polyolefin-based elastomers, polyurethane-based thermoplastic elastomers, polyamides, polybutadiene, polyisobutylene, polystyrene-butadiene-styrene, poly(2-chloro-1,3-butadiene) (2-chloro-1,3-butadiene), silicon, thermoplastic polyurethane (TPU), polyurethane (PU), polysiloxane (PDMS or h-PDMS), polymethyl methacrylate (PMMA), polyether ether ketone (PEEK), polymers such as ultra-high molecular weight polyethylene (UHMWPE) and silicone rubber, copolymers, composite materials, and a mixture thereof, but is not limited thereto. The soft material layer SML may further include liquid state and/or gas state of ethanol dispersed in the elastomer. By heating and/or cooling the soft material layer SML, the volume of the soft material layer SML may be changed by contracting and expanding a volume of the elastomer surrounding an ethanol molecule through vaporization and/or liquefaction of ethanol, by heating and/or cooling the soft material layer SML. Although the ethanol is used to form a material dispersed in the elastomer in the embodiment, the material is not particularly limited as long as the material is a material having a boiling point of a temperature (about 300° C. or less) that may not affect the light emitting pattern LDp.

Figure 12:
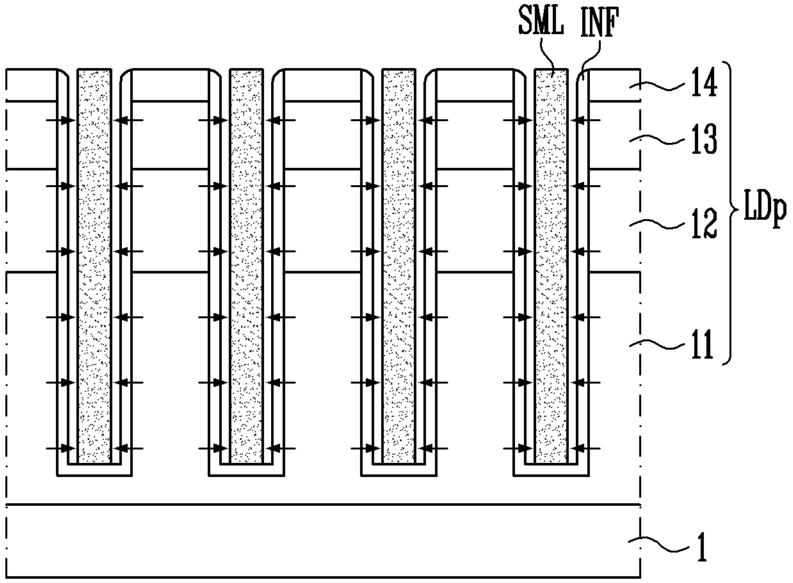
Figure 13:
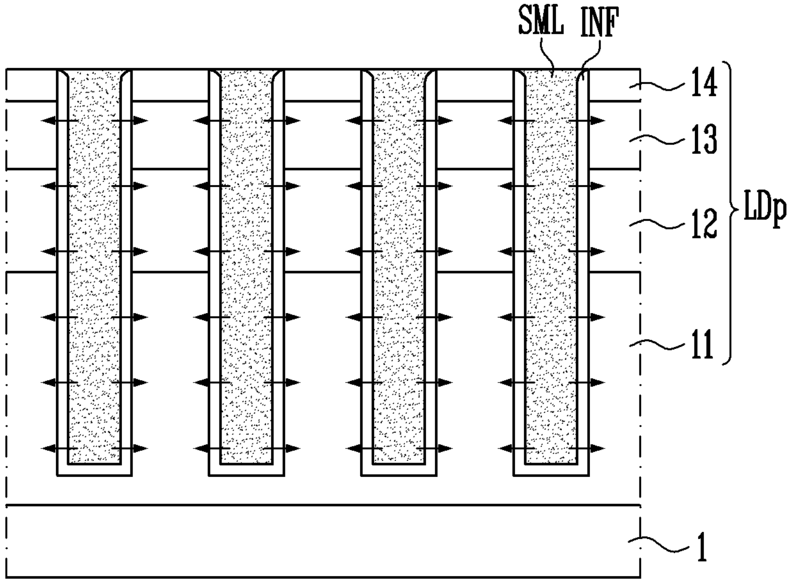
Figure 14:
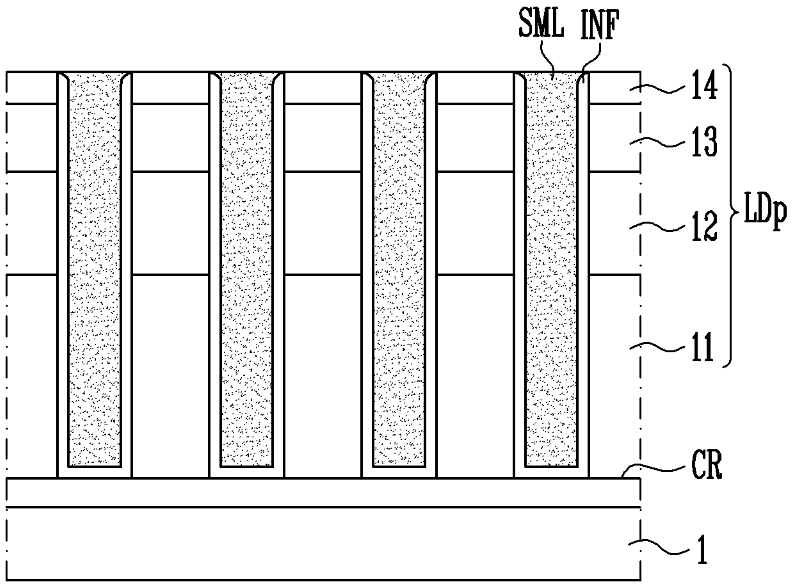

Referring to FIGS. 12 to 14, subsequently, a crack CR is formed at an end of the light emitting patterns LDp by deforming (contracting and/or expanding) the soft material layer SML.

As described above, as the soft material layer SML is contracted or expanded by an external stimulus (light or heat) and the volume of the soft material layer SML is changed, the crack CR may be formed at an end of the adjacent light emitting patterns LDp. Accordingly, the light emitting patterns LDp may be easily separated from the substrate 1. In case that the light emitting patterns LDp are separated through the deformation of the soft material layer SML, mass production may be possible compared to the conventional ultrasonic separation process, and the separation surface defect of the light emitting pattern LDp and the smash defect of the light emitting pattern LDp may be minimized.

In an embodiment, the soft material layer SML may be contracted and/or expanded by irradiating the soft material layer SML with light. As described above, in case that the soft material layer SML includes the photoactive polymer material, by irradiating the soft material layer SML with light with a wavelength that enables cis-trans isomerization of the photoactive polymer material, a macroscopic volume change of the soft material layer SML may be caused by changing the molecular structure through isomerization.

In another embodiment, the soft material layer SML may be heated and/or cooled to contract and/or expand the soft material layer SML. As described above, in case that the soft material layer SML includes an elastomer and a liquid state and/or gas state of ethanol dispersed in the elastomer, the soft material layer SML may be heated and/or cooled to change the volume of the soft material layer SML by contracting and expanding the volume of the elastomer surrounding the ethanol molecule through vaporization and/or liquefaction of ethanol.

Figure 15:
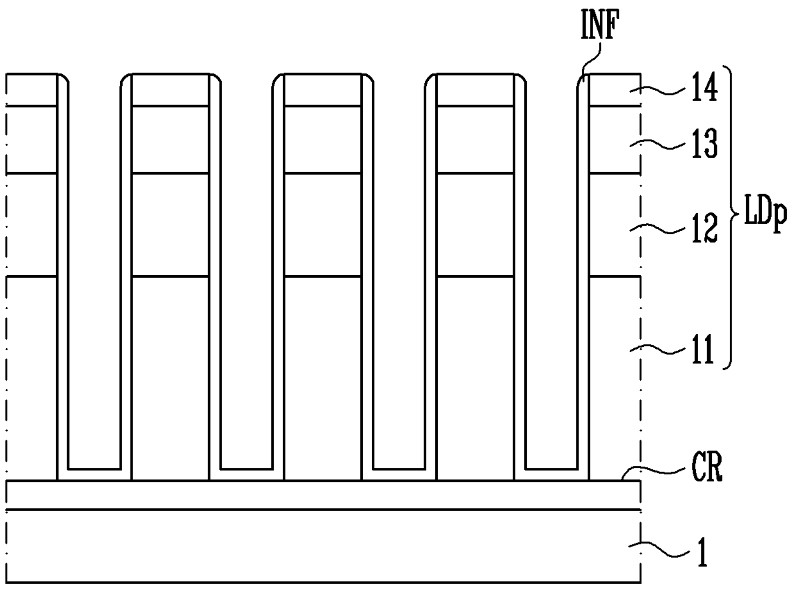

Referring to FIG. 15, subsequently, the soft material layer SML is removed. The soft material layer SML may be removed by washing or vaporization. In a process of washing the soft material layer SML, the light emitting patterns LDp may be separated from the substrate 1. Since an additional separation process may be omitted, a manufacturing process may be simplified.

Figure 16:
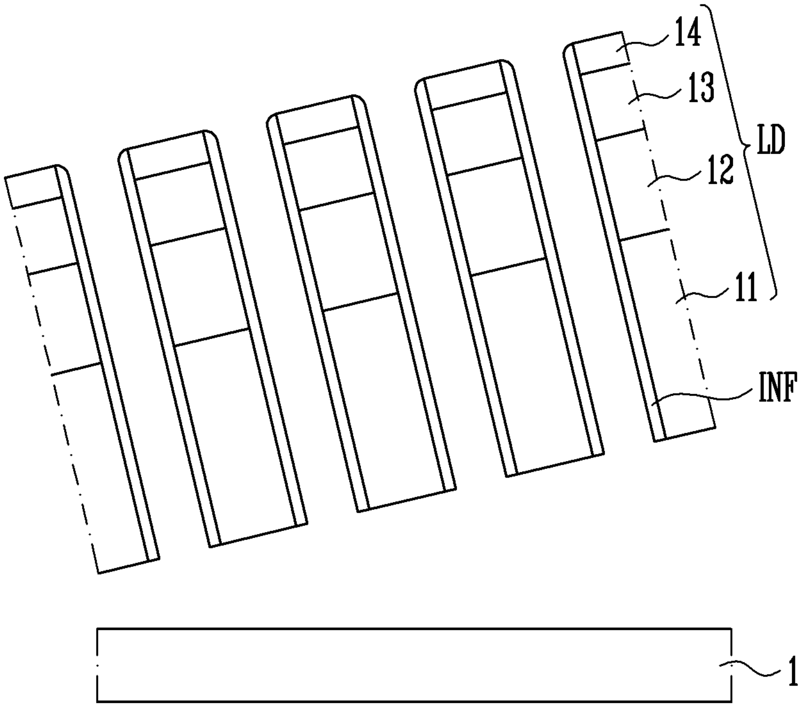

Referring to FIG. 16, subsequently, the light emitting elements LD may be manufactured by separating the light emitting patterns LDp from the substrate 1. According to the method of manufacturing the light emitting element LD, since the light emitting patterns LDp may be easily separated from the substrate 1 by the contraction and/or expansion of the soft material layer SML formed between the light emitting patterns LDp, mass production of the light emitting element LD may be possible, and the separation surface defect and the smash defect of the light emitting element LD may be minimized.

Subsequently, an apparatus for manufacturing the light emitting element according to the above-described embodiment is described.

Figure 17:
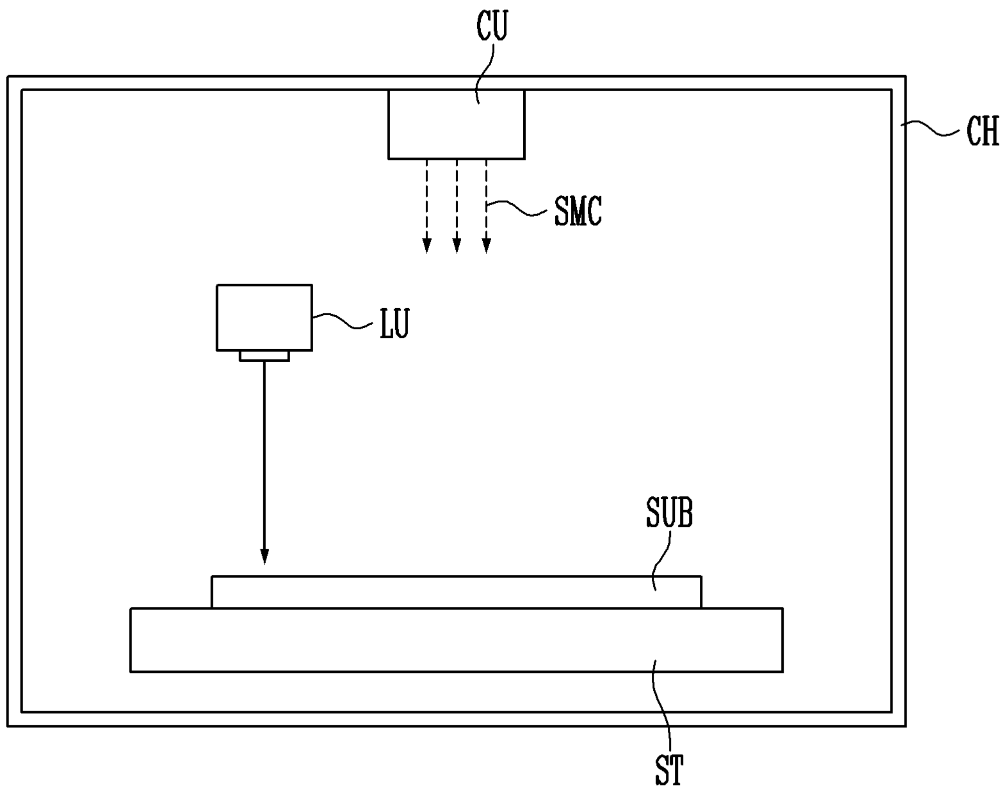
FIGS. 17 and 18 are schematic structural diagrams illustrating an apparatus for manufacturing a light emitting element according to an embodiment.
Figure 18:
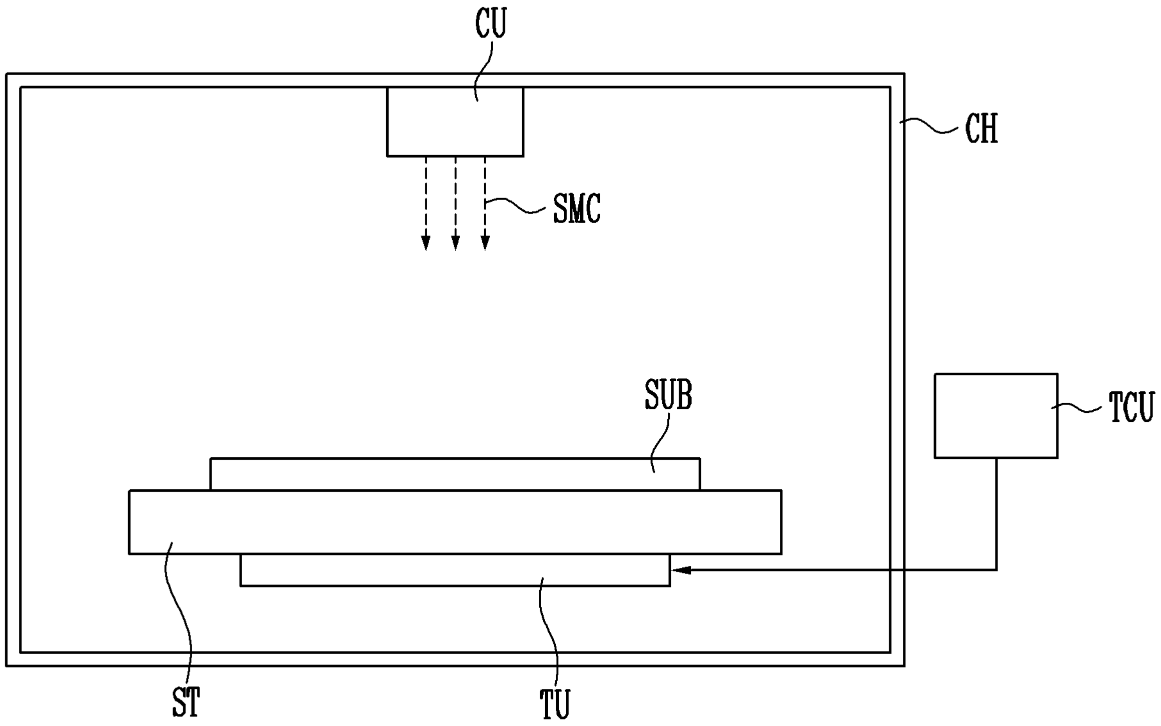

FIGS. 17 and 18 are schematic structural diagrams illustrating an apparatus for manufacturing a light emitting element according to an embodiment. Hereinafter, components substantially identical to those of FIGS. 1 to 16 are denoted by the same reference numerals, and detailed reference numerals are omitted.

Referring to FIGS. 17 and 18, an apparatus for manufacturing a light emitting element according to an embodiment may include a chamber CH, a stage ST, a coating device CU, a light irradiation device LU, and/or a temperature control device TCU and TU.

The chamber CH may be a space in which manufacturing or separation of a light emitting element is performed. Although not shown separately, a gate valve through which a target substrate SUB enters and exits may be disposed at a side of the chamber CH. In case that the light emitting element LD is manufactured or separated in the chamber CH, an appropriate process temperature may be maintained during heating and/or cooling of the target substrate SUB. However, the disclosure is not limited thereto, and the chamber may be omitted according to an embodiment.

The stage ST may provide a space in which the target substrate SUB is disposed. An overall shape of the stage ST may follow a shape of the target substrate SUB. For example, in case that the target substrate SUB has a rectangular shape, the overall shape of the stage ST may be rectangular, and in case that the target substrate SUB has a circular shape, the overall shape of the stage ST may be circular. Although not shown separately, the stage ST may be coupled to a stage moving unit and may be moved in a horizontal or vertical direction by the stage moving unit.

The target substrate SUB may be seated on the stage ST for manufacturing and/or separation of the light emitting element. Target substrates SUB may be simultaneously seated on the stage ST according to a scale of the chamber CH and/or the stage ST. Although not shown separately, a substrate aligner may be installed on the stage ST to align the target substrate SUB. The substrate aligner may be formed of a quartz or ceramic material, and may be provided in a form of an electrostatic chuck, but is not limited thereto. In describing an apparatus for manufacturing a light emitting element according to an embodiment, the target substrate SUB may be substantially the same as the substrate 1 shown in FIG. 6. As another example, as shown in FIG. 10, the target substrate SUB may be provided in the chamber CH in a state in which the light emitting pattern LDp is formed on the substrate 1. Hereinafter, a case where the target substrate SUB is the substrate 1 on which the light emitting pattern LDp is formed as shown in FIG. 10 is described.

The coating device CU may be disposed and/or moved to overlap the stage ST. The coating device CU may be a device for forming the soft material layer SML of FIG. 11 between the light emitting patterns LDp of the target substrate SUB, and may be a slit coating device, a spin coating device, an inkjet printing device, or the like, but is not limited thereto. Hereinafter, a case where the coating device CU is the inkjet printing device is described. The coating device CU may include a print head and nozzles that provide a path through which ink, for example, a soft material composition SMC, may be sprayed from the print head. Although not shown separately, the print head may be coupled to a print head moving unit and may be moved in a horizontal or vertical direction by the print head moving unit. The soft material composition SMC sprayed by the nozzles may be supplied to an upper surface of the target substrate SUB.

The soft material composition SMC may be provided in a solution state. As described above, the soft material composition SMC may include a soft material that may be contracted or expanded by an external stimulus to change a volume of the soft material. The soft material may be a solid material that is provided in a dispersed state in a solvent and finally remains on the target substrate SUB, e.g., between the light emitting patterns LDp after the solvent is removed. The solvent may be a material that is vaporized or volatilized by room temperature or heat. The solvent may be acetone, water, alcohol, toluene, or the like. Since a detailed content of the soft material is described with reference to FIGS. 11 to 13 and the like, an overlapping content is omitted.

As described above, the apparatus for manufacturing the light emitting element LD may include the light irradiation device LU or the temperature control device TCU and TU for deforming the soft material layer SML of the target substrate SUB.

Referring to FIG. 17, the light irradiation device LU irradiates, with a laser beam, a surface of the target substrate SUB for a light reaction of the soft material layer SML. The laser beam emitted from the light irradiation device LU may have a wavelength range that enables cis-trans isomerization of the above-described soft material layer SML. Accordingly, a macroscopic volume change of the soft material layer SML may be caused by changing the molecular structure through photoisomerization of the photoactive polymer material of the soft material layer SML as described above.

Referring to FIG. 18, the temperature control device TCU and TU may serve to cool and/or heat the target substrate SUB to deform the soft material layer SML. The temperature control device TCU and TU may include a temperature control unit TCU and a thermoelectric element TU. The temperature control unit TCU may serve to maintain an appropriate process temperature in consideration of an elastomeric property of the elastomer of the soft material layer SML described above. The thermoelectric element TU may absorb or radiate heat according to a polarity of an applied current. Since the target substrate SUB may be cooled or heated by such Peltier effect, the soft material layer SML may be easily deformed. FIG. 18 illustrates the thermoelectric element TU as a means for cooling and/or heating the target substrate SUB, but the disclosure is not limited thereto, and a heat source for heating the target substrate SUB, a cooling unit for cooling the target substrate SUB, and/or the like may be separately provided. As the heat source, heat conduction of a sheath heater, heat radiation of a sheath or lamp heater, a heating method using a laser, a heating method using generation of heat by an electric field applying device, and the like may be applied, the disclosure is not limited thereto. As the cooling unit, a heat sink of copper (Cu), aluminum (Al), or the like having high thermal conductivity may be applied, or a cooling method by a refrigerant may be applied. The cooling unit may include a refrigerant supply device, a refrigerant circulation device, and the like, but is not limited thereto.

The apparatus for manufacturing the light emitting element according to the above-described embodiment may form the soft material layer SML between the light emitting patterns LDp of the target substrate SUB by using the coating device CU, and contract and/or expand the soft material layer SML of the target substrate SUB by using the light irradiation device LU or the temperature control device TCU and TU. Accordingly, since the light emitting elements may be easily separated by the contraction and/or expansion of the soft material layer SML formed between the light emitting patterns LDp, mass production of the light emitting element may be possible and the separation surface defect and the smash defect of the light emitting element may be minimized as described above.

Those skilled in the art may understand that the disclosure may be implemented in a modified form without departing from the above-described essential characteristic. Therefore, the disclosed methods should be considered in a description point of view not a limitation point of view. The scope is shown in the claims not in the above description, and all differences within the scope will be construed as being included in the disclosure.

The invention claimed is:

1. A method of manufacturing a light emitting element, the method comprising:

providing light emitting patterns on a substrate;

providing a soft material layer between the light emitting patterns;

deforming the soft material layer, the deforming the soft material layer forming a crack at an end of the light emitting patterns between the light emitting patterns and the substrate; and separating the light emitting patterns from the substrate along the crack.

2. The method according to claim 1, wherein the soft material layer is contracted or expanded by an external stimulus, and a volume of the soft material layer is changed.

3. The method according to claim 1, wherein the deforming of the soft material layer comprises irradiating light to the soft material layer.

4. The method according to claim 3, wherein the soft material layer includes a photoactive polymer material.

5. The method according to claim 4, wherein the photoactive polymer material includes a trans-cis photoisomer.

6. The method according to claim 1, wherein the deforming of the soft material layer comprises heating the soft material layer.

7. The method according to claim 6, wherein the soft material layer includes an elastomer.

8. The method according to claim 1, further comprising: forming an insulating layer on the light emitting patterns.

9. The method according to claim 8, wherein the soft material layer is provided directly on the insulating layer.

10. The method according to claim 1, wherein the soft material layer is provided by slit coating, spin coating, or inkjet printing.

11. The method according to claim 1, further comprising: removing the soft material layer between the deforming of the soft material layer and the separating of the light emitting patterns.

12. The method according to claim 1, wherein the providing of the light emitting patterns comprises:
providing a light emitting stack on the substrate; and
etching the light emitting stack.

13. The method according to claim 12, wherein the light emitting stack comprises:
a first semiconductor layer;
a second semiconductor layer disposed on the first semiconductor layer; and
an active layer disposed between the first semiconductor layer and the second semiconductor layer.

14. The light emitting element manufactured by the method of claim 1.

15. An apparatus for manufacturing a light emitting element, the apparatus comprising:
a stage on which a target substrate including light emitting patterns is disposed;
a coating device that provides a soft material layer on the light emitting patterns; and
a light irradiation device or a temperature control device that deforms the soft material layer and forms a crack at an end of the light emitting patterns between the light emitting patterns and the target substrate.

16. The apparatus according to claim 15, wherein the light irradiation device contracts or expands the soft material layer by irradiating light to the soft material layer.

17. The apparatus according to claim 15, wherein the temperature control device heats or cools the soft material layer to contract or expand the soft material layer.

18. The apparatus according to claim 17, wherein the temperature control device includes an electric field applying device.

19. The apparatus according to claim 17, wherein the temperature control device includes a thermoelectric element.

20. The light emitting element manufactured by the apparatus of claim 15.

* * * * *